CIRCUIT COMPONENT

Filed May 4, 1966

ERNEST H. CARLSON, JR.
*INVENTOR.*

BY Herzig, Walsh & Blackham

ATTORNEY.

United States Patent Office 3,465,267
Patented Sept. 2, 1969

3,465,267
CIRCUIT COMPONENT

Ernest H. Carlson, Jr., 7333 W. 90th St., Los Angeles, Calif. 90045

Filed Mar. 4, 1966, Ser. No. 531,815
Int. Cl. H01h *7/10, 7/14;* H03h *7/38*
U.S. Cl. 333—76 13 Claims

ABSTRACT OF THE DISCLOSURE

The invention is an electronic component which is a bifilar wound capacitor coil having circuit connections whereby any inherent inductive effect can be selectively eliminated by introducing the current at two electrical points. These points may be both ends of both windings. Inductance taps are provided along the length of both windings whereby a part of a winding may be shunted by connecting a tap to the end of a winding, and in this manner, any combination of inductance and capacitance can be realized.

This invention relates generally to the physical structure of an electronic component particularly suitable for high frequency operation (three megacycles and higher) and for high temperature operation (in the range of 400° F. and above). More particularly, the invention is concerned with a circuit component having a predetermined capacitance or inductance and capacitance which may be employed as a capacitor component or as an inductor-capacitor component connectable in a series or parallel or other inductive capacitive circuits.

Most of the inductors and capacitors available to the high frequency circuit designer are of a configuration suitable for power application and radio frequency circuit application. In such low frequency applications the magnitude of inductance inherent in a standard capacitor component will have little or no effect on the characteristics of the completed circuit. However, in ultra high frequency circuits carrying electromagnetic energy at frequencies in the range of megacycles or kilomegacycles, such standard components will tend to change the transfer characteristics of the circuit from a desired one to one of no utility. Thus, in ultra high frequency circuits, it is the practice to provide essential compensation for the indutance inherent in conventional electronic circuit components including capacitor elements. Such compensation is often only empirically determinable and is always undesirably expensive.

It is also recognized that the environment of present day electronic components may be substantially different from the power and radio applications of the past. For instance, it is often desirable or necessary to utilize components which may be formed to fit very limited and exacting physical space requirements, as in printed circuits for computer or missile applications. Furthermore, with the increasing use of elements which do not require warm up time or heated filaments, the need is becoming increasingly apparent for capacitive and inductive components which provide a stable impedance having less variation throughout a wide range of temperatures and a predetermined impedance in any environment.

In addition to the above mentioned problems there is a need, recognized by those skilled in the art of circuit assembly designs, for the provision of pretested sub-circuit components. The present invention is readily adapted for such use.

Briefly, in one of the embodiments of the present invention a capacitor is comprised of a bifilar insulated wire wound coil wherein any inherent inductive effect is selectively eliminated by introducing the current at two electrical points, such as both ends, of each "coil plate winding" thus formed. For the present discussion the term "coil plate winding" refers to one strand of the bifilar insulated wire. As will become more apparent from the following detailed specification, such a capacitor or capacitive and inductive sub-circuit component may be sealed in a dielectric which has desirable electrical, thermal, and physical properties for a specific type of application as adjacent to the leading edges of supersonic air-frames where high temperatures are frequently encountered.

It is a further object of the invention to provide an inductance-capacitive sub-circuit component made of an insulated bifilar winding which can be fabricated in a variety of desired regular or irregular shapes.

The foregoing and other objects of the invention will be better understood from the following description of specific embodiments of the invention, read in connection with the accompanying drawing, in which.

Figure 1:
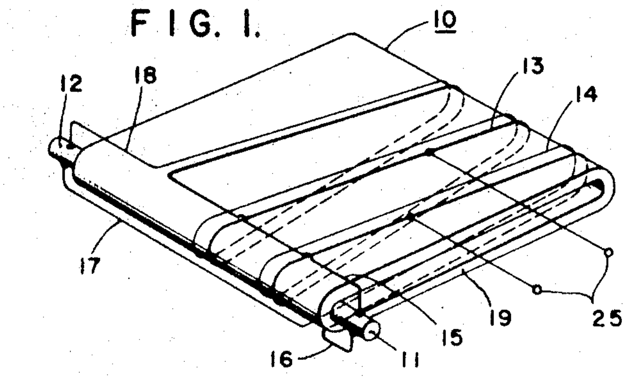
FIGURE 1 is a perspective view of a simplified structure illustrating a method of fabricating a representative construction of the invention.

In FIGURE 1 a simplified electrical circuit component is indicated generally by the numeral 10. The connection terminals are at 11 and 12.

The "plates" of the capacitor are formed by two separate coil windings bifilar wound whereby the wires are juxtaposed throughout the length thereof. The first coil plate winding 13 is indicated as a heavy line, and the second coil plate winding 14 is indicated as a light line. Usually the bifilar winding will be more than one layer in thickness whereby the capacitive effect is greatly increased. As shown, both ends of the (heavy) coil plate winding 13 may be connected to the terminal 11 by the lines 15 and 16, and similarly, both ends of the coil plate winding 14 may be connected to terminal 12 as indicated by the lines 17 and 18.

Both coil plate windings 13 and 14 are wound on a coil form or insulated coil vehicle 19 which can be any shape but as seen here is substantially a flat rectangle.

Any non-magnetic material capable of holding the windings during the manufacture thereof can be used and, if it is to be an integral part, it must also be able to withstand temperatures of the expected environment. For example, the coil form 19 may be constructed of ceramic, phenolic, Teflon, copper, aluminum, fiberglass, or the like. On the other hand, in some cases the coil form 19 will be such that it can be removed from the coil plate windings 13 and 14 or deformed with coil plate windings 13 and 14 after which the component shown in FIGURE 1 may be suitably encapsulated to hold its shape and form. Furthermore, the capacitor component shown in FIGURE 1 can be made with a variety of wire sizes and types to give a desired resistance which resistance is substantially independent of the capactive requirements.

It will be understood, of course, that the insulation used on the bifilar wire of coil plate windings 13 and 14 must have suitable dielectric constant and heat resistant properties. Wire coated with suitable polymers and ceramic insulating material may be used. It becomes readily apparent that the dielectric constant of the material of the wire and/or the potting compound encapsulating the coil plate windings will influence the capacity of the component 10, at least to the extent that the use of materials having a high dielectric constant will allow increased capacity for any given size. Thus the capacitance may be increased by factors of 20 or more with the use of presently available high dielectric constant materials.

Moreover, since the current to such a non-inductive capacitor is introduced at both ends of coil plate winding, the resistance thereof becomes less effective and the current carrying capacity of a coil capacitor is effectively doubled by providing double lead lines. This construction increases the feasibility of using aluminum or other wires in applications where weight or radioactivity restrictions must be considered.

With the illustration of FIGURE 1 it is seen that the method of manufacture includes securing the terminals 11 and 12 to the form 19, freeing the lines 15 and 18 which may be conveniently termed the inner ends or inner end portions for later connection to the terminals 11 and 12, wrapping the form 19 with the bifilar wire to form coil plate windings of a desired capacity, then freeing the lines 16 and 17 which may be conveniently termed the outer ends, and finally connecting the lines 15 and 16 to the terminal 11 and the lines 17 and 18 to the terminal 12. This method may be modified to provide one or more inductance taps 25 connected to intermediate turns of either or both of the coil plate windings. The wound capacitor 10 may then be formed as desired and encased in a rigid (or resilient, high temperature, etc.) potting compound, depending on the environment of utilization. Using this simple method of manufacture, the critical characteristics may be closely controlled by simply selecting the desired materials from those which are now commercially available. The method of manufacture may be accomplished by hand winding of special devices or automated production lines for quantity production.

Figure 2:
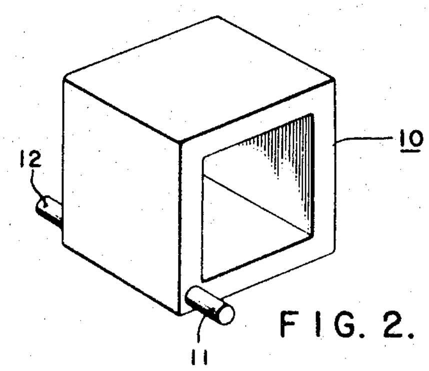
FIGURE 2 shows the coil wound circuit component formed as a hollow cubical shape, the walls of which form the circuit component and which can be placed over a portion of another circuit element.

After the capacitor has been wound on the coil form 19 shown in FIGURE 1, it may be formed (or originally wound) as a unit to nest compactly into a closely fitted assembly. For example, it may be wound as a hollow cubical shape shown in FIGURE 2 or other shapes. Moreover, the construction illustrated in FIGURE 2 may be used to insulate thermally, electrically or physically another circuit element (not shown) which it partially surrounds.

The embodiment of FIGURE 1 illustrates a simple structure providing a capacitor having substantially no inductive characteristic. It is unique in that it is comprised of a bifilar wound wire coil, one wire for each plate of the capacitor which is free of the inductance characteristics which have made such capacitor structures impractical for many applications in the past, particularly in high frequency applications. It will be seen that with each surge of current into the terminal 11, for example, the current flows into the coil plate winding 13 at both ends through the lines 15 and 16 in opposition, thus providing what appears to be a phenomena of opposing and cancelling magnetic fields in each half of the coil plate winding 13. The same is true of the coil plate winding 14 because of its two connecting lines 17 and 18 to the terminal 12 so that a non-inductive effect results. In actuality, inductance of such a structure has not been detected, indicating that the effects of a magnetic field are prevented by this arrangement.

However, an embodiment of the present invention in which the inductance of one or both of the coil plate windings is at least partially used makes possible the provision in a single unitary sub-circuit component combining both predeterminable inductance and predeterminable capacitance.

For low frequency resonance, large inductances are required and therefore cores (not shown) of magnetic iron are used to enhance the inductive effect. At high frequencies, however, even without any magnetic core, very few turns of wire will suffice to provide all the inductance needed and the problem which has plagued circuit designers is to provide a capacitor having a very small amount of inductance which will not effect the desired relation of the over-all circuit inductance to produce the desired circuit requirements.

Figure 3:
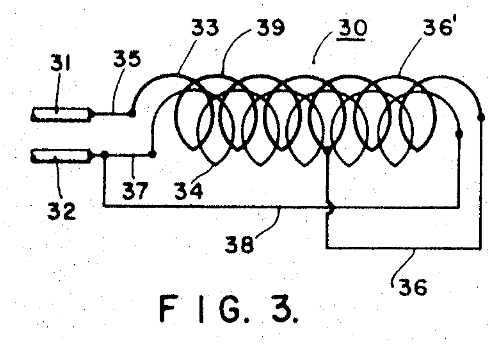
FIGURE 3 is a diagrammatic illustration of one form of the invention when connected as a series resonant sub-circuit.

In the present invention, as illustrated in FIGURE 3, a series combination of inductance and capacitance is provided by a single sub-circuit component 30. The two terminals 31 and 32 are connected to the coil plate windings 33 and 34, respectively. The coil plate winding 33 is connected to the terminal 31 by a line 35, and at least some portion 36' of the turns of the coil plate winding 33 is shunted by means of a shunt connection 36. This shunted portion 36' results in the non-inductive capacitive element of the coil plate winding 33 while an unshunted portion 39 is both capacitive and inductive.

The coil plate winding 34 has both of its ends connected to the terminal 32 as indicated by a line 37 and a shunt line 38 whereby it is non-inductive. It will be seen that the unshunted turns of the coil plate winding 33 form the inductance portion 39. Thus the component 30 performs substantially as if it were a series circuit with a capacitance of the sub-circuit component 30 defined by the entire coil plate windings 33 and 34, and an inductance defined by the portion 39. It should be realized that in an actual construction the shunt connection 36 and the lines 35, 37 and 38 are very short and the windings are so arranged that short lines can be used.

Figure 3A:
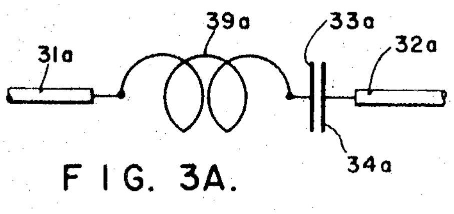
FIGURE 3A is a wiring diagram showing the electrical equivalent of the sub-circuit of FIGURE 3.

FIGURE 3A shows the electrical circuit equivalent to the subcircuit component 30 of FIGURE 3. It is seen that there is provided between the terminals **31*a* and 32*a*, corresponding to the terminals 31 and 32, a series circuit of an inductance 39*a* and a capacitor having plates 33*a* and 34*a***, corresponding to the similarly numbered elements illustrated in FIGURE 3. In addition to the simple series sub-circuit component discussed above, many other sub-circuit components may be constructed in accordance with the teachings of my invention.

Figure 4:
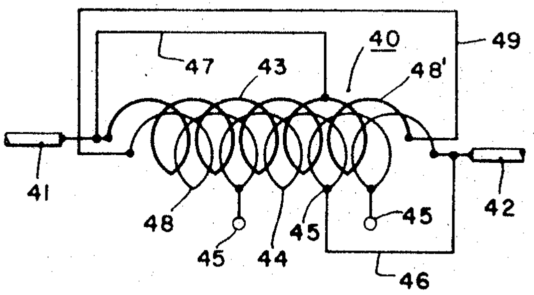
FIGURE 4 is a diagrammatic illustration of another embodiment of the invention connected as a parallel resonant sub-circuit.

For instance, FIGURE 4 illustrates a sub-circuit component 40 connected to provide an inductance and capacitance in parallel between the terminals 41 and 42. The sub-circuit component 40 is constructed physically very similarly to the sub-circuit component 30 illustrated in FIGURE 3. A terminal 42 is connected to one end of a coil plate winding 44, with a shunt connection 46 coupling one of the intermediate voltage taps 45 in the coil plate winding 44 to the terminal 47. Similarly, a shunt connection 47 connects one end of the coil plate winding 43 to an intermediate turn thereof. However, care must be taken to prevent relative current flows in the coil plate windings 43 and 44 which will tend to cancel out the desired inductive effects. The construction illustrated in FIGURE 4, where the inductive portions 48 and 48' are not juxtaposed, necessitates having the relative current flow in portions 48 and 48' to produce aiding inductive fields. In order to provide a particular desired sub-circuit component the inner end of one coil plate winding is connected to the outer end of the other by an additional short line 49. As a result, the circuit connectors shown in FIGURE 4 are electrically quite different from those of FIGURE 3. Although each of the coil plate windings 43 and 44 are both capactive and inductive, a parallel sub-circuit component is illustrated in FIGURE 4.

Figure 4A:
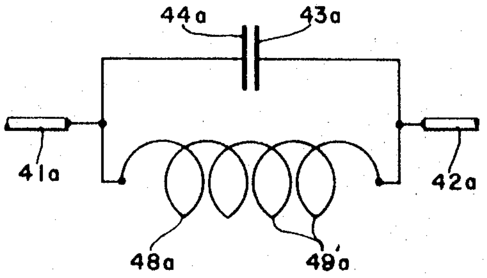
FIGURE 4A is a wiring diagram of the electric circuit equivalent of the sub-circuit of FIGURE 4.

It will be seen that at least some turns of the coil plate windings 43 and 44 provide inductive portions 48 and 48'. Careful consideration of the phenomena of this embodiment of my invention clearly indicates that a parallel resonant circuit has been created. The equivalent circuit diagram is shown in FIGURE 4A in which the corresponding parts are similarly numbered except with the letter *a* following each number.

Figure 5:
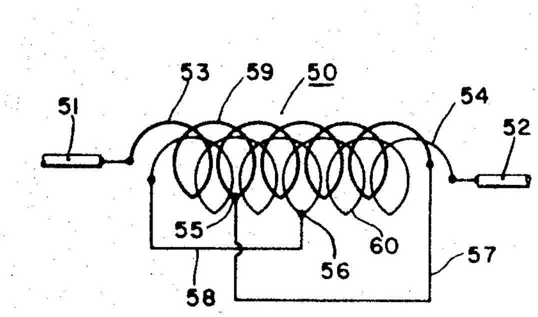
FIGURE 5 is a diagrammatic illustration of an embodiment of the invention in which each of the coil plate windings contributes some inductance to a series sub-circuit of the type defined in connection with FIGURES 3 and 3A.

FIGURE 5 illustrates yet another of the many possible embodiments of my invention in which both of the coil plate windings of a sub-circuit component 50 are only partially shunted to intermediate taps to provide some inductance. The terminals 51 and 52 are connected to the coil plate windings 53 and 54, respectively, at the inner and outer ends of the coil plate windings but alternate ends of each coil plate winding are shunted to taps, as indicated at 55 and 56, on one of their own intermediate turns by means of the shunt connections 57 and 58, respectively. Thus inductance is provided by a portion 59 of the coil plate winding 53 and a portion 60 of the coil plate winding 54. As illustrated in FIGURE 5, again care must be taken that the inductive portions are not arranged so that current flow therethrough tends to cancel desired inductance. By analogy to the discussion of FIGURES 3 and 3A it is apparent that the sub-circuit component 50 performs substantially as if it were a series circuit of an inductor, a capacitor, and an inductor. Obviously, the subcircuit component of FIGURE 5 could be modified by adding a connecting line between the ends of the coils remote from the terminals to form another parallel subcircuit component.

As explained above, one of the basic concepts of the present invention is a method of fabricating a non-inductive capacitor. This is accomplished by making a bifilar winding (two strands or wire filaments) and then joining their respective start (inner) and finish (outer) ends so that current entering and leaving the capacitor will tend to produce two opposite inductive fields which effectively cancel each other, the net effect of which is a capacitor with zero inductance. Obviously, the capacitor of the present invention is adaptable as a pulse capacitor for applications in the high frequency circuits of the radar "S" and "X" bands. It is also applicable to other frequencies and circuitry requiring non-inductive capacitance.

Some of the main advantages which can be accomplished by the utilization of my invention are as follows: a completely non-inductive capacitor; in addition to the conventional cylindrical shape, shapes such as hollow cylinders, bent rectangles, cones, etc., can be readily formed; the disclosed method of manufacture will provide capacitors operable from temperatures of minus 65° F. and below to temperatures of 400° F. and above; and the described method will facilitate manufacture of capacitors that can have a predetermined magnitude of inductance, up to the maximum inductance of all the turns comprising the coil plate windings without changing the capacitance.

Usually the method of winding a capacitor on the coil form will be accomplished by automatic equipment of the type used in making coils or transformers. However, because of the unique advantages of the present invention and the probability of single and special applications it may prove most economical to wind and solder connections of such capacitor by hand—as is sometimes done in other precision electronic equipment.

It will be seen from the foregoing description that I have provided a simple formable structure, suitable for fabrication from material insensitive to ambient temperature or other environmental characteristics which can provide a sub-circuit component containing a desired, predetermined and pretested combination of inductance and capacitance. It is to be understood, however, that the invention is not restricted to the specific embodiments described above in detail, and that many variations and modifications, and many applications of the invention will be apparent to those skilled in the art without departing from the true spirit and scope of the invention as defined in the appended claims. For instance, in certain constructions it may be desirable to use winding arrangements other than bifilar wherein the coils formed by such windings may still be at least partially shunted to take advantage of the teaching of the present invention or such a winding as quadrafilar having pairs of turns shunted at a point remote from the terminals are, for practical purposes, equivalent to the bifilar windings discussed in detail herein. One method of constructing such a quadrafilar wound capacitor is to join the wires at the inner portion of the coil to form two pairs of parallel filaments, to wind the coil and then join both filaments of each pair respectively to a terminal. Otherwise the method of constructing a capacitor with a quadrafilar winding is very similar to that discussed above in connection with FIGURE 1. Moreover, by the use of two, three, or more strand filar wound coils it becomes apparent that "I" and "*w*" sub-circuit filter components may be manufactured in accordance with the teachings of my invention. Therefore, I intend by the appended claims to include all such modifications as come within the true spirit and scope of my invention.

The bifilar windings need not necessarily be in the form of wires. They may be in the form of metal strips or ribbons or sheets shaped into a comparable configuration to that resulting from the use of wires. It may be noted also that the capacitor may be constructed from a single turn of the bifilar windings whether using ordinary wires or conductors having other configurations. Ordinarily, the insulation on a wire is in the form of a casing or coating of insulating material. When the windings are in the form of a strip or ribbon or sheet, the insulation can be in the form of sheets of insulating material. The insulation is not limited to sheets either, but may be applied by painting or dipping or otherwise, thus, facilitating the process of fabrication of components having insulation with the required properties for particular applications.

The foregoing disclosure is representative of preferred forms of the invention and is to be interpreted in an illustrative rather than a limiting sense, the invention to be accorded the full scope of the claims appended hereto.

I claim:

1. A coil wound capacitor comprising a bifilar wire wound pair of coil plate windings, a pair of terminal connections, one terminal connection being connected to one end of a first said coil plate windings, the second of said terminal connections being connected to one end of the second of said coil plate windings; and electric circuit means connected for selectively shunting at least a portion of one of said coil plate windings.

2. A capacitor as in claim 1 including electric circuit means connected for selectively shunting at least a portion of said other coil plate winding.

3. A capacitor as in claim 1 including electric circuit means connected for completely shunting said first coil plate winding, and said second coil winding.

4. A capacitor as in claim 1 wherein said coil plate windings are separately insulated, said shunted portion of said one coil plate winding producing a preselected inductive effect.

5. A capacitor as in claim 1 wherein said one terminal connection is connected to both ends of one of said coil plate windings and the second terminal connection is connected to only one of and of the other of said coil plate windings, the other end of the other coil plate winding being connected to an intermediate turn on the other coil plate winding whereby only a portion thereof is shunted.

6. A capacitor as in claim 1 wherein said component comprises a deformable coil form having said plate coil windings wound thereon.

7. A capacitor as in claim 1 wherein said terminals are each connected to both ends of one of the coil plate windings respectively, whereby the current flow thereto is from both ends of each of said coil plate windings.

8. A capacitor as in claim 1 including a first return shunt connection between the other end of said first coil plate winding and an intermediate point of said first winding and a second return shunt connection between the other end of said second coil plate winding opposite said second terminal end, and an intermediate turn of said second coil plate winding.

9. A capacitor as in claim 1 wherein one of said terminals is connected to one end of said first coil plate wind ing and the other is connected to the opposite end of said second coil plate winding, a first shunt connection between the opposite end of said first plate coil winding and an intermediate point thereof, and a second shunt connection between the first end of said second coil plate winding and an intermediate point thereof, and means for providing a connection between the first end portion of said second coil plate winding and the second end portion of said first coil plate winding.

10. A capacitor as in claim 1 including shunting means for connecting at least one end of each of said coil plate windings to an intermediate point thereon to reduce selectively the inherent inductance of the wound configuration of the coil plate windings.

11. A coil wound capacitor comprising a bifilar wire wound pair of coil plate windings, each having ends to which terminal connection can be made, a pair of electrical terminals, inductance tap means provided along the length of said windings whereby both ends of each winding can be connected to each terminal to provide a capacitor without inductance or at least one end of one winding can be connected to a tap on a winding to provide a combination of inductance and capacitance.

12. A capacitor as in claim 11 having inductance taps connected to an end of at least one of said coil windings with at least one end of each winding connected to a terminal.

13. A method of providing selective relationships between the capacitance and inductance in a coil wound capacitor comprising a pair of bifilar wire wound coil plate windings each having terminals and inductance taps along the windings, comprising the steps of connecting at least one end of both windings to a terminal to provide a capacitor without inductance, and connecting at least one end of one winding to an inductance tap on a winding to provide selective combinations as between capacitance and inductance.

References Cited

UNITED STATES PATENTS

| | | | |
|---|---|---|---|
| 2,626,317 | 1/1953 | Malm. | |
| 2,521,513 | 9/1950 | Gray. | |
| 2,998,840 | 9/1961 | Davis | 154—2.6 |
| 2,864,060 | 12/1958 | Batchelor | 333—32 |
| 3,025,480 | 3/1962 | Guanella | 333—33 |
| 3,029,400 | 4/1962 | Nelson | 333—77 |

HERMAN K. SAALBACH, Primary Examiner

C. BARAFF, Assistant Examiner

U.S. Cl. X.R.

317—242; 333—79, 32; 336—150